United States Patent [19]
Ravi

[11] Patent Number: 5,131,963
[45] Date of Patent: Jul. 21, 1992

[54] SILICON ON INSULATOR SEMICONDUCTOR COMPOSITION CONTAINING THIN SYNTHETIC DIAMONE FILMS

[75] Inventor: Kramadhati V. Ravi, Atherton, Calif.

[73] Assignee: Crystallume, Menlo Park, Calif.

[21] Appl. No.: 237,131

[22] Filed: Aug. 26, 1988

Related U.S. Application Data

[63] Continuation of Ser. No. 121,308, Nov. 16, 1987, abandoned.

[51] Int. Cl.⁵ .......................................... H01L 31/0264
[52] U.S. Cl. .................................. 148/33.3; 148/33.4; 148/DIG. 135; 437/974
[58] Field of Search ............... 156/DIG. 68; 423/446; 437/83, 84, 100, 89, 105, 107, 974; 148/33.3, 33.4, DIG. 135; 427/248.1, 249

[56] References Cited

U.S. PATENT DOCUMENTS

| | | | |
|---|---|---|---|
| 4,447,497 | 5/1984 | Manasevit | 156/605 |
| 4,768,011 | 8/1988 | Hattori et al. | 338/5 |
| 4,863,529 | 9/1989 | Imai et al. | 437/100 |
| 4,891,329 | 1/1990 | Reisman et al. | 148/33.4 |
| 4,939,043 | 9/1990 | Biricik et al. | 437/33.4 |
| 4,981,818 | 1/1991 | Anthony et al. | 437/974 |

*Primary Examiner*—Mary Wilczewski
*Attorney, Agent, or Firm*—Kenneth D'Alessandro

[57] ABSTRACT

A process is provided for making a semiconductor element comprising a single-crystal layer of silicon on a diamond insulator.

4 Claims, 4 Drawing Sheets

SILICON ON INSULATOR SEMICONDUCTOR COMPOSITION CONTAINING THIN SYNTHETIC DIAMONE FILMS

This is a continuation of application Ser. No. 121,308 filed Nov. 16, 1987, now abandoned.

The present invention is directed to a method for making semiconductor elements comprising a single crystal layer of silicon on a diamond insulator. The present invention is further directed to novel semiconductor elements made according to that process.

BACKGROUND OF THE INVENTION

A component useful for integrated circuits is an active semiconductor film on an insulating substrate, since it has superior operational characteristics compared to a noninsulated active semiconductor film. For example, a conventional noninsulated active semiconductor film made of silicon, which itself is not an insulator, suffers from the problem of cross-talk, which is the transportation of charge carriers along the silicon substrate between adjacent transistors in an integrated circuit. As a consequence of this problem, silicon semiconductor films on insulators have been developed, which include the formation of single-crystal silicon films on insulating substrates such as sapphire, spinale and on amorphous silicon dioxide, followed by recrystallization of the polysilicon films. This technology, termed SOI (silicon on insulator) technology has additional advantages in that the insulator layer provides a shield against ionizing radiation which could generate charge carriers within the bulk silicon, thus leading the flow of parasitic currents between circuit elements. Also, complementary metallic oxide semiconductor (CMOS) circuits may suffer from the problem known as latch-up whereby different elements of the circuit interfere with each other through the bulk silicon when such crosscommunication is undesirable. Cross-talk, and in particular latch-up, are problems confronting the further reduction in dimension of circuit elements for integrated circuits.

The problems with current SOI technology, such as silicon on sapphire, silicon on silicon dioxide, and the like, include the following. When sapphire is used as the insulator, the quality of epitaxial silicon films deposited on sapphire are inferior to conventional Czochralski crystals, or expitaxial films deposited on single-crystal silicon. Very thin (on the order of 1-2 microns) silicon epitaxial films are typically poor in quality with a large density of defects which severely limit the capabilities of circuits built with them. Thus, the achievement of high-quality thin epitaxial silicon films is required to maximize the advantage of SOI technology, but such thin films have heretofore not been achievable with acceptable performance.

Silicon on sapphire technology is also extremely expensive since it requires the growth of a single sapphire crystal, slicing of the single crystals into wafers, polishing the wafers, and depositing the silicon on the wafers by CVD (chemical vapor deposition) techniques. Growing silicon on silicon dioxide insulators, followed by recrystallization of the polysilicon films by thermal annealing, while theoretically possible, has not yet achieved acceptable quality or efficiency of manufacture.

Therefore, due to the above disadvantages of SOI technologies heretofore known, particularly to the disadvantage of extreme expense in producing the SOI semiconductors, broadbased commercial markets for SOI semiconductors have failed to materialize, with the only substantial market being specialized military uses where costs of production are of less concern.

It is therefore an object of the present invention to provide a novel silicon on insulator technology wherein the insulator is synthetic diamond.

It is a further object of the present invention to provide novel silicon on diamond semiconductors which may be readily made using relatively inexpensive processing techniques.

These and other objects will be apparent from the following description and appended claims and will further be apparent from the practice of the invention.

SUMMARY OF THE INVENTION

The present invention provides semiconductor elements comprising a single crystal layer of silicon on a diamond insulator. A basic element is formed by the steps of diffusing into one surface of a substrate an etch-stop material which is not etchable by at least one etching process which etches the substrate, to form a diffusion-prepared layer; epitaxially depositing a silicon layer onto the. diffusion prepared layer of the substrate; depositing a diamond layer onto the epitaxial silicon layer; removing the substrate by an etching process which does not etch the etch-stop material whereby the etching ceases at the diffusion-prepared layer; and selectively removing the diffusion-prepared layer to form the semiconductor element. A support layer may also be deposited upon the surface of the diamond insulator which is not in contact with the silicon layer. This basic element is further processed to provide novel semiconductor elements comprising single layers of silicon on diamond for various applications.

DESCRIPTION OF THE PREFERRED EMBODIMENTS

Figure 1A:
FIG. 1 schematically shows the steps in a preferred embodiment according to the process of the present invention for making a semiconductor element comprising a single layer of silicon on a diamond film.
Figure 1B:
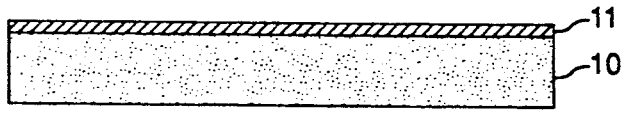
Figure 1C:
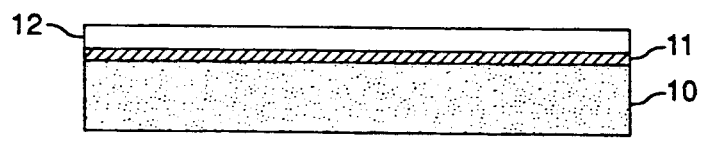
Figure 1D:
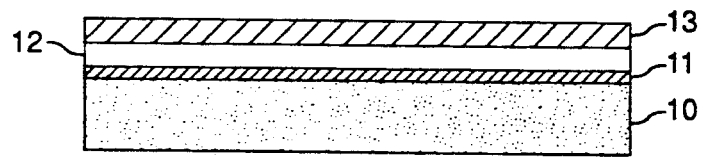
Figure 1E:
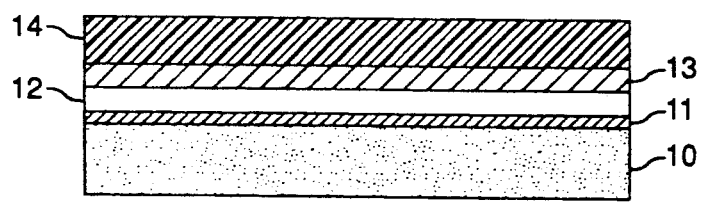
Figure 1F:
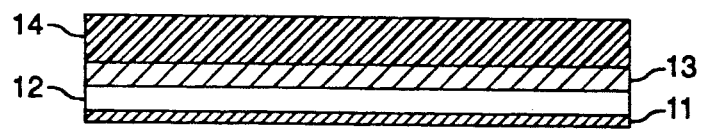
Figure 1G:
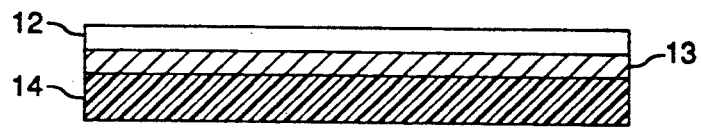
Figure 2A:
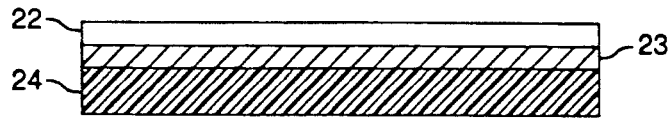
FIG. 2 schematically shows the steps in a preferred embodiment for making a semiconductor element comprising silicon wafers separated by diamond insulator.
Figure 2B:
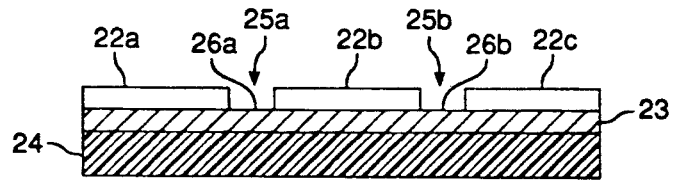
Figure 2C:
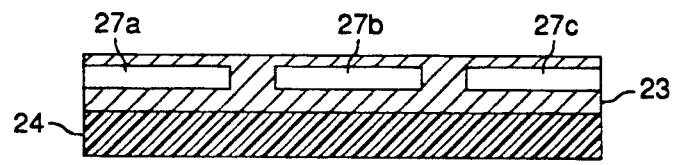
Figure 2D:
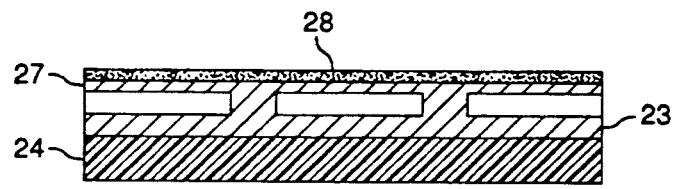
Figure 2E:
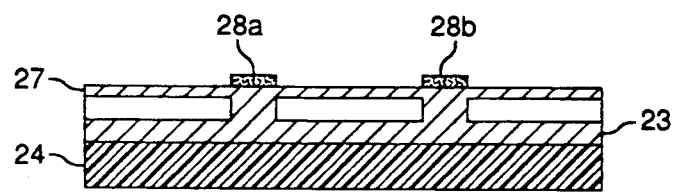
Figure 2F:
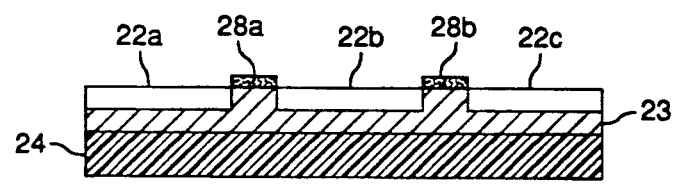
Figure 2G:
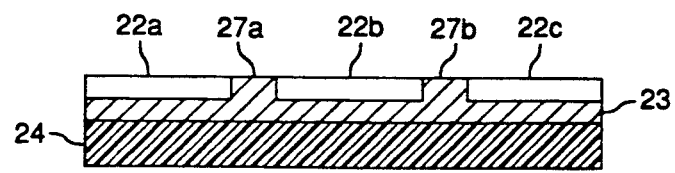

The use of a silicon on a sapphire insulator as a semiconductor element is feasible because it is possible to grow a single-crystal sapphire which can be sliced into wafers and polished to provide an essentially smooth surface on which to grow a single crystal silicon layer. However, single-crystal diamonds made by synthetic routes are not feasible, and even if it would be possible to make a synthetic single-crystal diamond, there is a likelihood that the lattice mismatch between diamond and silicon would preclude the growth of a high-quality singlelayer silicon on such a diamond surface. Therefore, the present invention provides a novel method for providing a single-crystal silicon layer on a synthetic diamond insulator where the singlecrystal silicon is of suitable quality to serve as a semiconductor surface for integrated circuits.

Referring to FIG. 1, the first step is to apply etch-stop layer 11 to one surface of a substrate 10. This will enable one at a later stage as described hereinbelow to etch away the substrate by an etching process which stops at the etch-stop layer. Neither the substrate nor the etch-stop layer will comprise a part of the final semiconductor element produced according to this embodiment. Preferably, the substrate 10 will be a silicon wafer and one surface of it will be diffusion-prepared by diffusing a high concentration of boron into the surface to form etch-stop layer 11. Processes for diffusing boron into a silicon surface are known as, for example, $B_2H_6$ phase diffusion or ion implantation followed by annealing.

Then silicon 12 is epitaxially deposited upon the diffusion-prepared layer by conventional methods. The processes for epitaxial deposition of silicon are well known. The thickness of the epitaxial silicon layer 12 will preferably be within the range of about 1-2 microns, which is a thickness useful for semiconductor applications.

In the next step according to the present invention, a layer of diamond 13 is deposited upon the epitaxial silicon film 12. The thickness of the diamond depends on whether the final structure is to be selfsupporting, in which case the diamond layer should be deposited to the thickness of about 15 to 20 mils., or if the final structure is to be supported by a substrate to be subsequently deposited upon the diamond layer as shown in FIG. 1. If a substrate is to ultimately support the structure, the diamond layer may be deposited in somewhat thinner thicknesses, such as in the range of 1 to 2 microns. Then a thicker polysilicon layer 14 may be deposited upon a diamond layer which will confer rigidity to the structure.

Then an appropriate etching process is utilized to etch away the substrate 10 (which is preferably silicon). The etching process is chosen such that the boron-diffused layer 11 will function as an etch-stop. Conventional etching reagents used for etching silicon include potassium hydroxide, mixtures of hydrofluoric acid and nitric acid, and a mixture of ethylenediamine-pyrocatechol-water.

The epitaxial silicon film 12 is exposed by removing the etch-stop layer 11 which is preferably a diffused boron-silicon layer. The diffused boron-silicon layer 11 may be removed, for example, by ion etching or by selective oxidation with subsequent removal of the oxide, by known techniques.

The resulting structure is a thin, high quality single-crystal layer silicon (12) on insulating diamond (13). Optionally, the bottom layer of the diamond may be supported by a supporting structure (14) such as polysilicon.

From the basic structure of a silicon layer 12 upon a thin film synthetic diamond layer 13 on a support, a variety of semiconductor elements may be produced. In one particular preferred embodiment, this multilayer structure is utilized for application in the technology of radiation-hardened integrated circuits where there is the requirement for multiple single-crystal silicon elements electrically isolated from each other, typically provided by providing back-to-back diodes around regions of silicon wafers, forming individual silicon islands surrounded by moats. The air in the moats functions as a dielectric; or dielectric isolation is attained when each silicon wafer is fabricated in a manner such as to provide individual islands of silicon surrounded by a dielectric such as polysilicon. Among these approaches, dielectric isolation is preferable because of the superior dielectric strength of polysilicon as compared to back-to-back diodes or air. However, a problem in the prior art is that the creation of dielectrically isolated wafers is complex and therefore it has heretofore been utilized mainly in only specialized applications.

Therefore, the present invention provides another embodiment of making silicon wafers isolated from each other by synthetic diamond. An advantage of the structure is the superior electrical resistivity and thermal conductivity of diamond. The preferred process for making such a device is shown in FIG. 2.

Referring to FIG. 2, a multilayer silicon on diamond component, as fabricated, for example, as shown in connection with FIG. 1, is provided comprising the silicon layer 22 on the thin synthetic diamond film 23 supported on a support such as polysilicon 24. A predetermined pattern is etched into the silicon layer 22 forming grooves 25A, 25B, etc., of which the bottom surfaces 26A, 26B, etc. consist of unexposed area of the underlying synthetic diamond film 23. By etching through to the diamond layer 23, individual epitaxial silicon wafers 22A, 22B, 22C, etc. are formed.

Synthetic diamond is then deposited around and over the epitaxial silicon islands 22A, 22B and 22C whereby the grooves 25A, 25B, etc. become solid diamond channels 27A, 27B, etc. and the silicon wafers 22A, 22B, 22C, etc. are covered with a thin diamond layer 27. A conventional photoresist 28 is then applied over the layer 27, then the photoresist is partially removed by utilizing the negative of the pattern used to form grooves 25A, 25B, etc. By removing the photoresist in this manner, photoresist islands 28A and 28B, etc. remain over the diamond channels 27A, 27B, etc., while the remainder of layer 27 becomes exposed. The exposed areas of layer 27 are then plasma etched to reveal the upper surfaces of the silicon wafers 22A, 22B, 22C, etc. Finally, the remaining photoresist islands 28A, 28B are removed to complete the fabrication of the dielectrically isolated silicon wafers, 22A, 22B, 22C separated by diamond channels 27A, 27B, etc., all of which overlay a synthetic diamond film 23 which in turn is supported by a substrate such as polysilicon 24.

Figure 3:
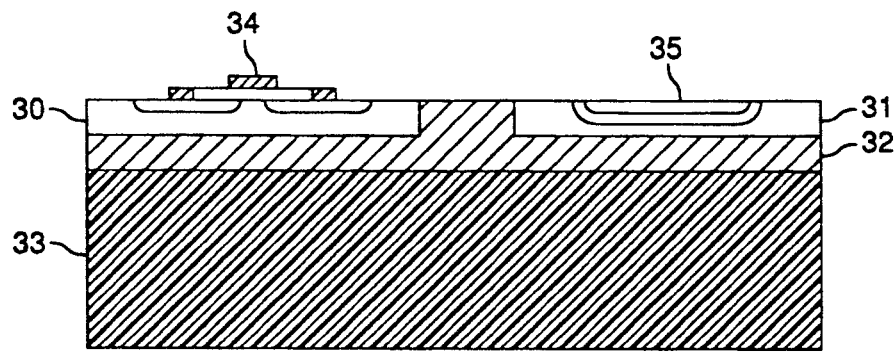
FIG. 3 illustrates an embodiment of a semiconductor device embodying the silicon wafers shown in FIG. 2.
Figure 4A:
FIG. 4 schematically shows the steps of the preferred embodiment for making gallium-arsenide wafers separated by silicon diamond insulators.
Figure 4B:
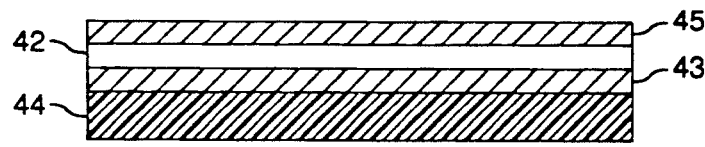
Figure 4C:
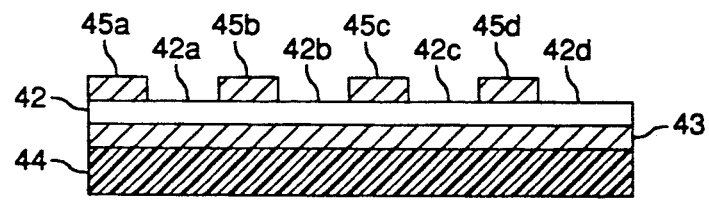
Figure 4D:
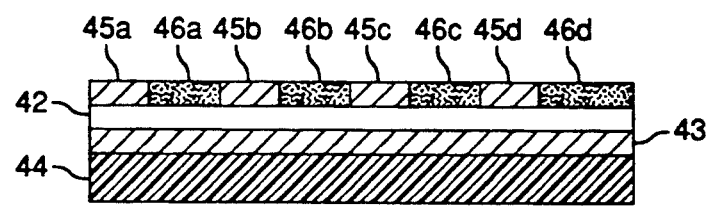
Figure 5A:
FIG. 5 schematically shows the steps of a preferred embodiment for making stacked silicon semiconductors applicable for three-dimentional integrated circuits.
Figure 5B:
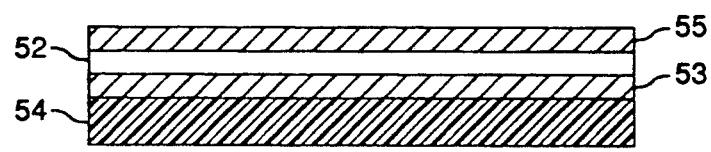
Figure 5C:
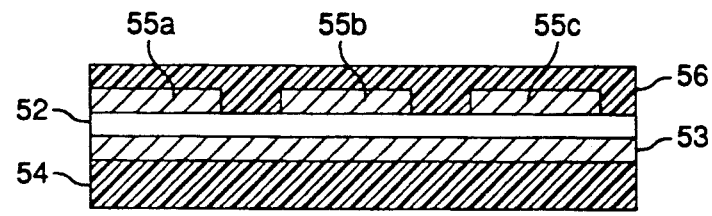
Figure 5C:
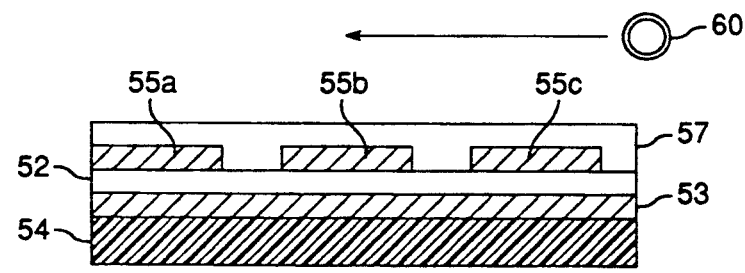
Figure 5D:
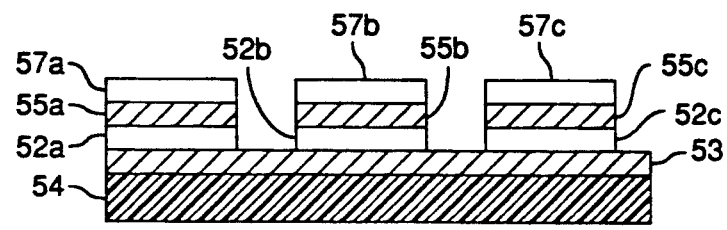

One of the applications of a structure produced in accordance with the method described in connection with FIG. 2 is to form BIMOS circuits where bipolar power transistors are built adjacent to MOS devices. Such a device is shown in FIG. 3 where one of the silicon wafers 30 is shown as accommodating an MOS transistor 34 and the other silicon wafer 31 is shown as accommodating a bipolar power transistor 35. Wafers 30 and 31 are insulated from each other and from the support 33 by synthetic diamond layer 32.

In another embodiment of the present invention, the silicon on diamond layers may be utilized to form components containing galliumarsenide semiconductors. A particular problem with gallium-arsenide components is dealing with the dissipation of heat generated from the device. The present invention provides an advantage in that synthetic diamond may be utilized as a heat sink and in accordance with the present invention a monolithic structure may be created in which the diamond forms an integral part of the gallium arsenide wafer.

Referring to FIG. 4, a thin silicon layer 42 on a synthetic diamond layer 43, which is in turn supported by support 44 is provided as, for example, in accordance with FIG. 1. A second diamond layer 45 is deposited upon the silicon layer 42. Then the diamond layer 45 is exposed to a predetermined pattern and etched, by processes described above, to provide islands of synthetic diamond 45A, 45B, 45C, 45D, etc. surrounded by exposed surfaces 42A, 42B, 42C, 42D, etc. of the silicon layer 42. The grooves between the diamond are then filled with gallium-arsenide by one of the conventional techniques for growing gallium-arsenide, such as liquid face epitaxy methods, chemical vapor deposition, and the like. The completed structure comprises on its upper surface, wafers of gallium-arsenide 46A, 46B, 46C, 46D, etc., separated by areas of diamond insulation, 45A, 45B, 45C, 45D, etc. all of which are in contact with a lower silicon layer 42. A silicon layer 42 is insulated from the support 44 by a diamond insulating layer 43. The diamond, 45A, 45B, etc., surrounding the gallium-arsenide and the diamond layer 43 beneath the silicon layer 42 function as heat sinks and dielectrics. The silicon layer 42 should be as thin as possible (on the order of less than 1 micron) to minimize the barrier effect to heat transfer between the galliumarsenide wafers 46A, 46B, etc. and the diamond layer 43.

In yet another embodiment of the present invention, the silicon on diamond components may be utilized to faricate three-dimensional integrated circuits wherein active elements of the circuits are built on top of each other. One of the advantages of the present invention is that in building smaller circuits, the smaller device geometries call for thinner dielectrics, higher doping densities, shallower junctions and higher conductivities. These requirements become increasingly difficult to achieve because of material and device limitations. One of the advantages features in the present invention is that many of these many of these inherent problems from scaling down conventional structures into three-dimentional integration become readily adaptable and practical utilizing diamond insulators in accordance with the present invention.

Referring to FIG. 5, there is shown a silicon layer 52 on diamond insulating layer 53 on a support 54, as produced, for example, as shown in accordance with FIG. 1 above. A second layer of diamond 55 is deposited upon silicon layer 52. Then a pattern is etched into layer 55 (not shown) to form a series of diamond island 55A, 55B, 55C, etc. upon the silicon layer 52. Areas between the islands 55A, etc. are filled and the islands are covered simultaneously by depositing polysilicon 56 over the wafers 55A, etc. The polysilicon in then converted to a single crystal by seeded, lateral liquid phase epitaxial growth by, for example, laterally moving a strip heater 60 near the surface of the polysilicon 56. Then the same pattern utilized to form the islands 55A, 55B, 55C is utilized to etch through the single crystal layer 57 and the silicon layer 52 to form isolated stacks comprising singlecrystal silicon 57A on diamond insulator 55A and second silicon layer 52A. The stacks are all in contact with a common diamond layer 53. Thus the ultimate device comprises multiple layers of singlecrystal interleaved with diamond for use in threedimentional integrated circuits.

Uses of the semiconductor elements according to the present invention may be used as semiconductor elements in integrated circuits with the problems of crosstalk and latch-up being essentially eliminated due to the presence of the insulating diamond layer. Moreover, the insulating diamond layer is obtained without the necessity of forming a single-crystal diamond by synthetic methods, which in any case would be technologically inachievable given the present state-of-the-art of diamond synthesis.

I claim:

1. A semiconductor element consisting of a semiconductor material supported by a polysilicon substrate, wherein an insulating diamond layer is disposed between said semiconducting material and said polysilicon substrate.

2. A multilayer semiconductor electronic component consisting of, in order, a substrate, an insulating diamond layer, a silicon layer and a layer comprising islands of semiconductor material separated by diamond insulation.

3. A semiconductor electronic component according to claim 2 wherein said substrate comprises polysilicon.

4. A semiconductor electronic component according to claim 2 wherein said semiconductor material comprises gallium arsenide.

* * * * *